United States Patent
Bardsley et al.

(10) Patent No.: US 6,882,292 B1
(45) Date of Patent: Apr. 19, 2005

(54) ANALOG TO DIGITAL CONVERTER WITH BANDWIDTH TUNING CIRCUIT

(75) Inventors: Scott Gregory Bardsley, Summerfield, NC (US); Christopher Dillon, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/753,921

(22) Filed: Jan. 7, 2004

(51) Int. Cl.[7] .............................................. H03M 1/10
(52) U.S. Cl. ..................... 341/121; 341/155; 341/144
(58) Field of Search ............................... 341/121, 155, 341/144, 120, 118

(56) References Cited

U.S. PATENT DOCUMENTS

| | | | | |
|---|---|---|---|---|
| 6,121,908 A | * | 9/2000 | Sevastopoulos et al. | 341/139 |
| 6,198,314 B1 | * | 3/2001 | Kase | 327/94 |
| 6,259,392 B1 | * | 7/2001 | Choi et al. | 341/150 |
| 6,369,744 B1 | * | 4/2002 | Chuang | 341/161 |
| 6,384,758 B1 | * | 5/2002 | Michalski et al. | 341/122 |
| 6,472,897 B1 | * | 10/2002 | Shyr et al. | 324/765 |
| 6,501,411 B1 | * | 12/2002 | Soundarapandian et al. | 341/161 |
| 6,570,411 B1 | | 5/2003 | Bardsley et al. | |
| 2004/0070530 A1 | * | 4/2004 | You | 341/163 |

OTHER PUBLICATIONS

Analog Devices, "10–Bit, 40 MSPS, 3 V, 74 m W A/D Converter", AD9203, 2001, pp. 1–24.
Analog Devices, "IF Digitizing Subsystem", AD9874*, 2003, pp. 1–40.
Analog Devices, "12–Bit, 105 MSPS/125 MSPS IF Sampling A/D Converter", AD9433, 2001, pp. 1–24.

* cited by examiner

*Primary Examiner*—Peguy JeanPierre
(74) *Attorney, Agent, or Firm*—Wolf, Greenfield & Sacks, PC

(57) ABSTRACT

A pipelined analog to digital converter. Each stage in the pipeline has a flash converter and a multiplying digital to analog converter. Each stage provides a digital bits and an analog residue that is passed to the next stage in the pipeline. The digital bits from all stages are combined in digital logic to produce the digital output of the converter. The flash converter in each stage has a set of comparators, each coupled to a reference ladder. A random number generator in connection with a switch matrix "shuffles" the reference inputs to the comparators. The comparators are latched as soon as practical after they are stable and the reference inputs are shuffled as soon as practical after the comparators are latched. Also, a bandwidth trim circuit is provided to compensate for different cutoff frequencies of the input impedances of the flash and multiplying digital to analog converters.

25 Claims, 9 Drawing Sheets

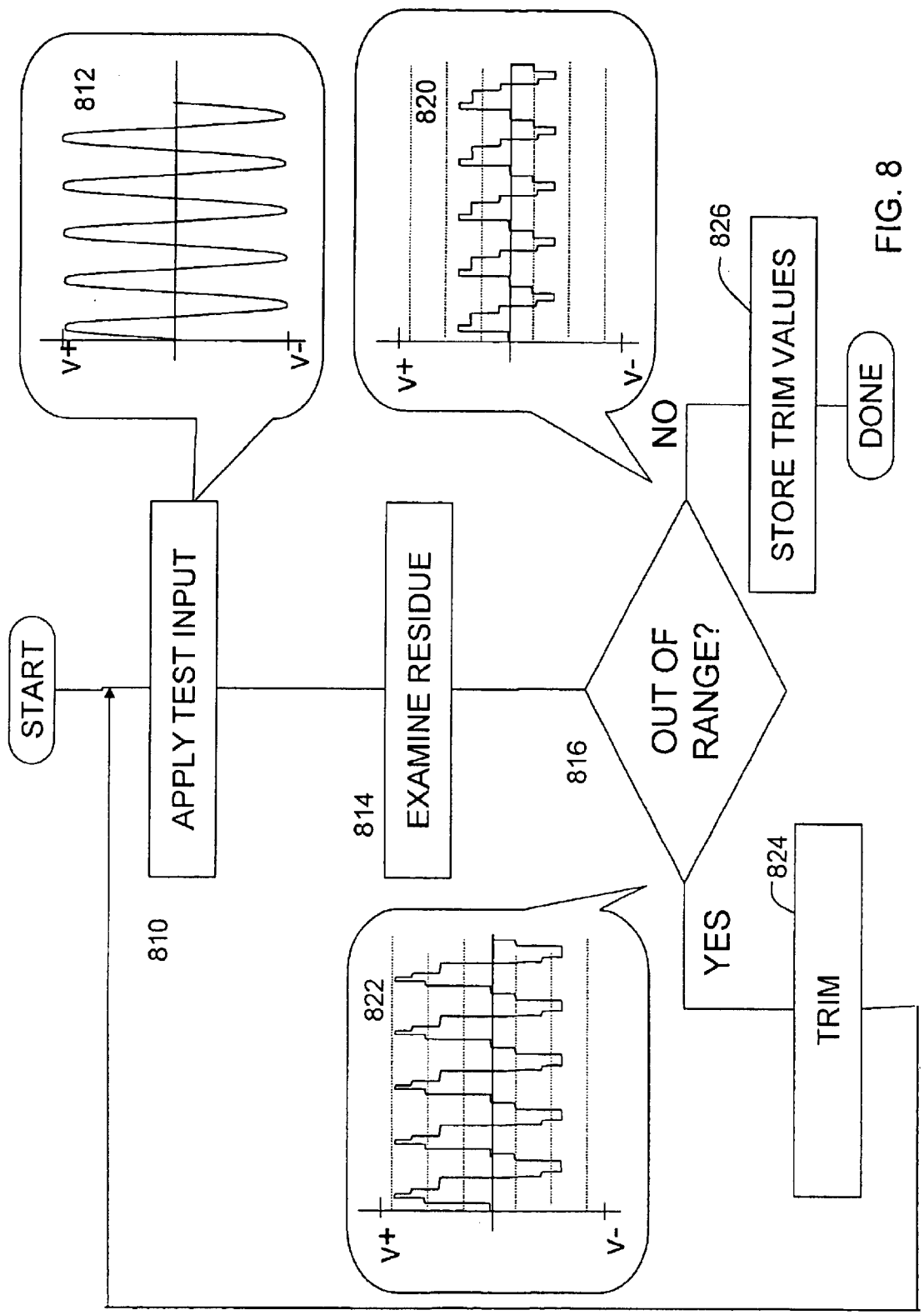

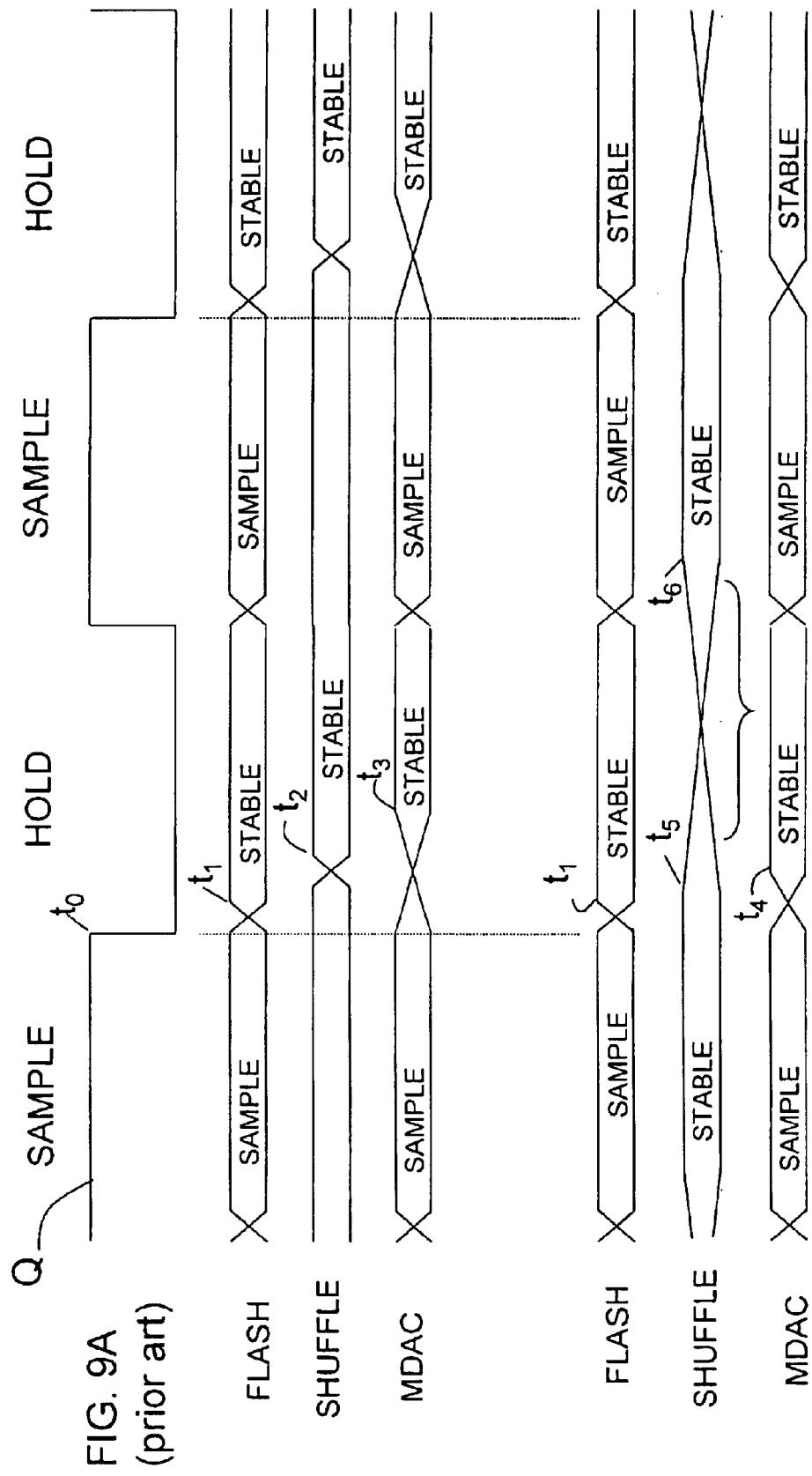

ANALOG TO DIGITAL CONVERTER WITH BANDWIDTH TUNING CIRCUIT

BACKGROUND OF INVENTION

1. Field of Invention

This patent relates generally to electronic circuitry and more specifically to analog to digital converters.

2. Discussion of Related Art

Analog to digital converters are used in many modern electronic systems. Many electrical signals are analog—meaning that the signal can take on any value in a range of values. However, many components in electronic systems operate on digital signals meaning that the value of the signal is represented at any time by "bits" of data, with each bit taking on only one of two possible states. Accordingly, there is a need for "analog to digital converters" to allow analog signals to be processed in digital form.

Many types of analog to digital converters are known. One type of analog to digital converter is called a "flash converter". A flash converter has multiple reference levels and comparators. Each comparator compares the analog input signal to one of the reference levels and produces an output that indicates whether the input is above or below the reference level. These signals are digital because each signal is in only one of two possible states. The outputs of the comparators taken together provide a digital indication of the value of the analog input signal.

The digital representation of the signal in this form does not exactly represent the value of the analog input. From the digital bits, it can only be determined that the input signal falls in a range between the largest reference that was below the value of the input signal and the smallest reference value that was above the value of the input signal. However, if this range, or "band," is small enough, the outputs of the comparators accurately represent the value of the input signal at any point in time.

The size of the "bands" is sometimes referred to as the "resolution" of the conversion. When the bands are very small, the conversion is said to have high resolution. The resolution that is acceptable depends on the specific application in which the analog to digital converter will be used.

One way to ensure that an analog to digital converter has sufficient resolution is to provide many reference signals that differ from each other by only a small amount. However, it is very difficult to make a single flash circuit with many reference levels and comparators. Accordingly, some analog to digital converters use a pipelined approach.

In a pipelined analog to digital converter, multiple stages are provided. Each stage accepts an analog input and produces digital bits representing the band in which the input signal falls. The stage also creates an analog output representing the difference between the digital representation of the signal and the actual analog signal. This difference is called the "residue." The residue can be passed to the next stage in the pipeline.

Each successive stage in the "pipeline" produces more digital bits and another residue signal that can be passed on to further stages, if more bits are desired. As more bits are produced, the resolution of the representation of the analog signal is improved. Conversely, the residue representing the difference between the analog signal and the representation based on the digital signal gets smaller.

An advantage of a pipelined converter is that a flash converter with a relatively few number of comparators can be used at each stage to produce the digital bits.

Some prior art pipelined converters are called "multiplying converters." Each stage in the pipeline multiplies the residue by a factor that is based on the increase in resolution provided by that stage. For example, if a stage produces enough bits to double the resolution of the converter, that stage will multiply the residue by two before passing it to the next stage. If a stage produces enough bits to quadruple the resolution, the residue signal is multiplied by four before it is passed to the next stage. The circuitry that computes and appropriately multiples the residue is sometimes referred to as a "multiplying digital to analog converter", or MDAC.

An advantage of a multiplying converter is that it keeps the residue signal from getting very small. Because smaller signals are more susceptible to noise than larger signals, a multiplying converter is less susceptible to noise than a converter that attempts to represent a residue without scaling. A second advantage is that each stage in the pipeline can be made the same because the residue signal will always be scaled to fall in the same voltage range. Though the digital bits generated in successive stages in the pipeline represent smaller and smaller numbers, multiplying the residue to keep it in a particular range does not affect the output of the converter. Digital bits from each stage are combined by digital logic circuitry in a way that weights the bits representing larger signals more than the bits that represent smaller signals.

For a pipelined converter to work accurately, the flash converter and MDAC in each stage of the pipeline should operate on the same signal. To ensure this, prior pipelined converters had sample and hold circuitry. A sample and hold circuit is a circuit that receives an input signal during one interval of time, generally called the sample interval. During the hold interval, the circuit has at its output a value representative of the input at the beginning of the hold interval. A conventional way to implement a sample and hold circuit is to connect a capacitor to the input signal through a switch. During the hold interval, the capacitor is connected to the input signal. The capacitor charges to a value that is representative of the input signal. As the input signal changes, the charge on the capacitor changes in proportion to the input signal. To start the hold interval, the capacitor is disconnected from the input so that charge is trapped on the capacitor. Because the amount of charge is determined by the input signal at the start of the hold interval, the output of the sample and hold circuit holds a sample of the input value during the hold interval.

Some prior multiplying analog to digital converters used switched capacitor structures in both the flash and the MDAC portions of each stage. These circuits used the capacitors in the switched capacitor structures to implement the sample and hold function.

An example of a switched capacitor structure is found in U.S. Pat. No. 6,570,411 entitled Switched-Capacitor Structures with Reduced Distortion and Noise and Enhanced Isolation, which is hereby incorporated by reference.

A prior product, the AD9433 sold by Analog Devices, Inc., used an MDC with a bank of capacitors to both hold the input signal and to subtract the amount necessary to produce the residue signal. During the sample interval, the all of the capacitors in the bank are charged by the input signal. At the end of the sample interval, all of the capacitors are disconnected from the input signal, leaving each capacitor charged to a level that represents the input signal at the end of the sample interval. Then, one end of each of the capacitors is connected to the input of the amplifier.

Also after the sample interval, the other end of each of the capacitors is switched to a reference voltage level. In the AD9433, each capacitor is switched to one of two reference levels—a high voltage reference or a low voltage reference. Connections to the reference levels introduce an offset at the input of the amplifier, with the amount of the offset being dependent on the relative number of capacitors connected to the high reference and to the low reference.

The relative number of capacitors connected to the high and low references is selected based on the output of the flash. In this way, the input to the amplifier is offset by an amount proportional to the output of the flash—which is what is required to create the residue signal.

In this device, all of the capacitors are nominally the same size. Accordingly, it should not matter which capacitors are connected to which reference level. However, it is not possible in practice to make all of the capacitors the same size. Differences in capacitors will lead to a small error in forming the residue signal. If the same group of capacitors is connected in the same way each time the flash output takes on a certain value, there will be a non-random error introduced in the residue signal. Such an error is termed "distortion."

To avoid distortion, the AD94333 used "capacitor shuffling"—meaning that, even though the total number of capacitors connected to each reference was still determined by the output of the flash, the specific capacitors connected to each reference was randomly selected. Randomly selecting the capacitors made the error introduced by the capacitors random. Random noise is usually referred to as "noise."

For some applications of analog to digital converters the allowable distortion is much lower than the allowable noise. Thus, even though capacitor shuffling introduces noise, the benefits of reducing distortion outweigh the harmful effects of introducing noise.

An example of such an application is a cellular telephone system. FIG. 1 shows a cellular telephone system 120. Such a cellular telephone system would have a plurality of cells. For simplicity, one cell is illustrated.

The cell contains a base station 122. Each base station has a number of receivers 124A . . . 124C. Each of the receivers is connected to an antenna 126. The antenna receives signals from cellular telephones 130A . . . 130D. The receivers convert the received signals into separate voice signals. Circuitry inside base station 122 connects the signal from each cellular telephone through the telephone network 128 to an intended recipient (not shown).

Signals received from cellular telephones contain information representing a telephone conversation modulated onto an analog carrier. Because base station 122 performs switching in digital form, the receivers must demodulate the information representing each telephone call and present it in digital form. To do this process in As is shown, there are more cellular telephones 130A . . . 30D than there are receivers. Each receiver can receive signals from more than one cellular phone simultaneously. A limiting factor in the design of a cellular base station is often the ability of the analog to digital converter to quickly and without distortion perform an analog to digital conversion. For example, better analog to digital converters will result in cellular base stations that can process calls from more cellular telephones.

Accordingly, it would be desirable to have an improved analog to digital converter.

SUMMARY OF INVENTION

It is accordingly, an object of the invention to provide an improved analog to digital converter.

It is also an object to provide an analog to digital converter that has improved accuracy. In accordance with one aspect of the invention, an analog to digital converter is provided with a stage that has a first subcircuit that produces a digital output and a second subcircuit that produces a residue output representative of the difference between the input to the stage and digital output of the first subcircuit. A trim circuit is included that allows the relative frequency response of the first and second subcircuit to be adjusted to reduce errors.

In another aspect, the invention includes a method to adjust the trim circuit.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings:

FIG. 8 is a flow chart of a process that can be used to adjust a trim circuit of FIG. 6; and FIGS. 9A and 9B are timing diagrams useful in understanding the operation of an improved analog to digital converter.

DETAILED DESCRIPTION

Figure 1:
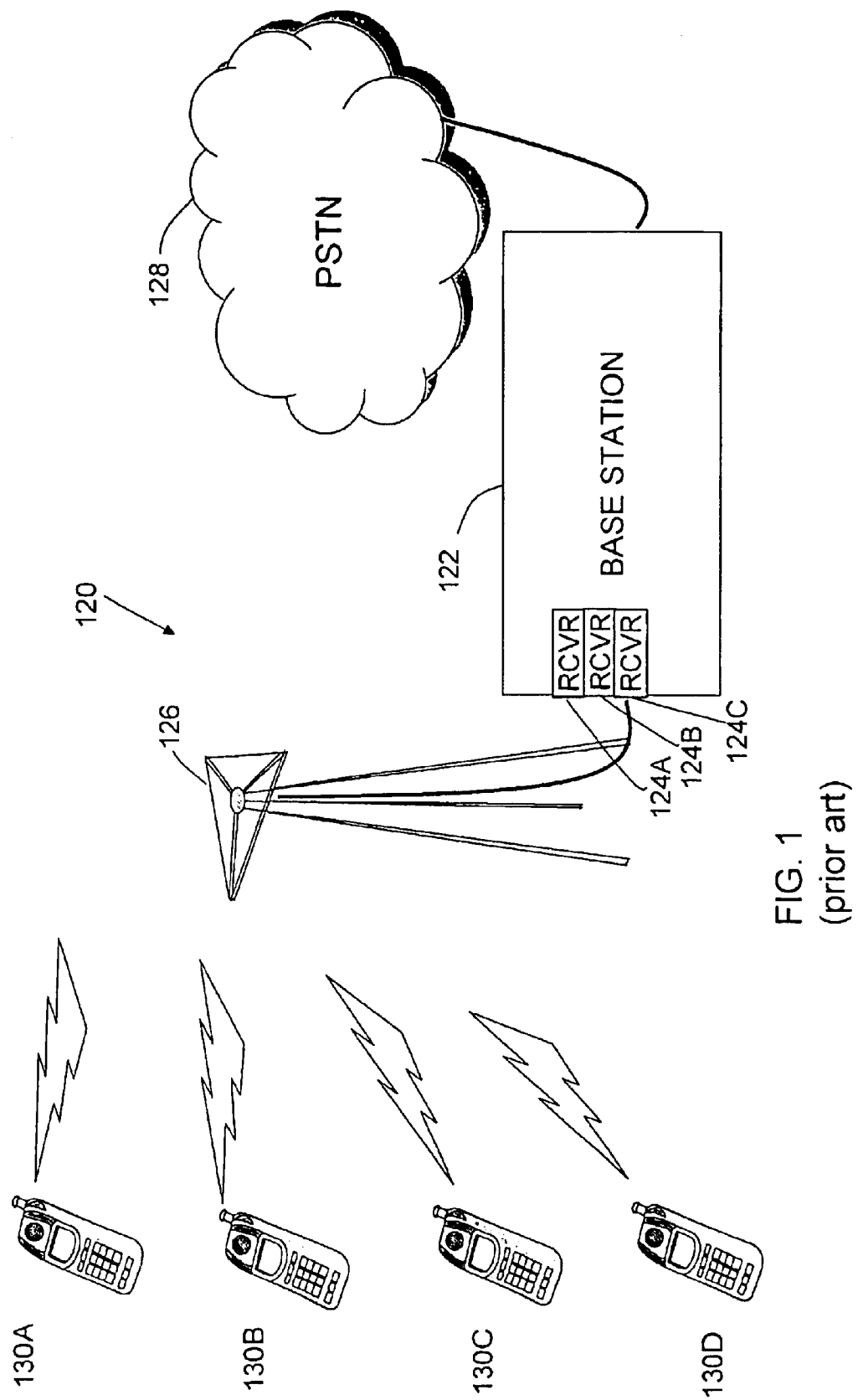
FIG. 1 is a sketch showing a cellular telephone system in which an improved analog to digital converter could be used.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Figures 2A, 2B:
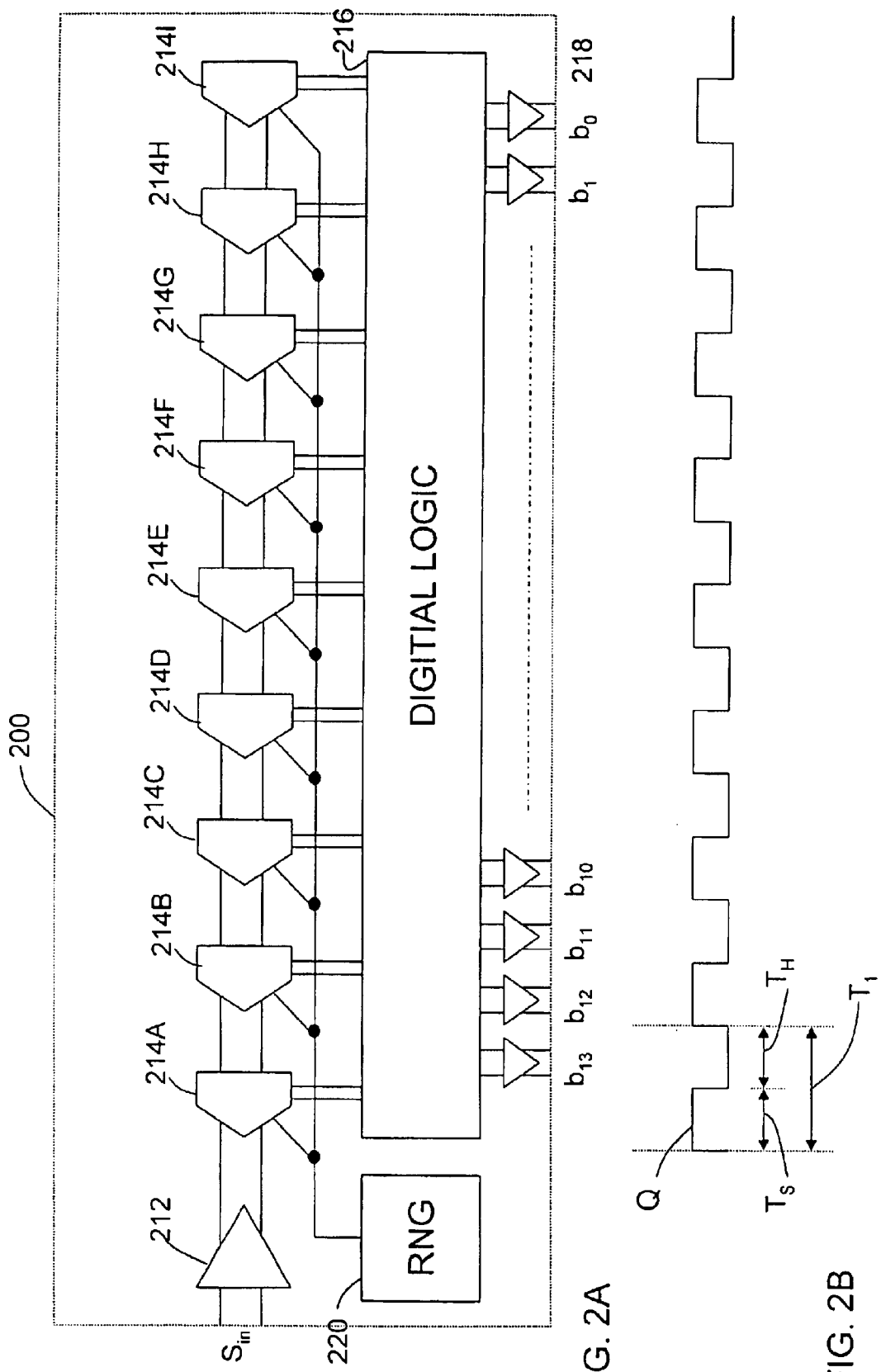
FIG. 2A is a sketch showing a high level block diagram of an analog to digital converter.
FIG. 2B is a sketch showing timing in the analog to digital converter of FIG. 2A.

FIG. 2A shows a high level block diagram of analog to digital converter 200. An analog input signal $S_{in}$ is applied as an input to analog to digital converter 200. The digital output 218 is represented as a plurality of digital signals $b_0 \ldots b_{13}$. In this embodiment, both the analog input and digital output signals are represented as differential signals. Preferably, the digital outputs are low foltage differential signals (LVDS). However, the format for representing the signals is not critical to the invention.

The analog input is applied to a buffer amplifier 212. The output of buffer amplifier 212 is applied to stage 214A. Stage 214A is the first stage in the pipeline within analog to digital converter 200.

In the analog to digital converter illustrated in FIG. 2A there are nine pipeline stages 214A . . . 214I. For simplicity of illustration, each of the pipeline stages is shown to be the same. However, it is not necessary that all the stages be the same. For example, each of the stages of the pipeline is shown to produce two digital output lines. Each stage could produce any number of outputs and it is not necessary that all of the stages produce the same number of digital outputs.

As in the prior art, stage 214A produces digital outputs that are applied to digital logic circuit 216. Stage 214A also provides an analog residue output that is applied to stage 214B. Stage 214B produces a certain number of digital bits that represent the input to stage 214B. Stage 214B in turn produces an analog output representing the residue at stage 214B. This residue is passed on to the next stage.

Each successive stage receives a residue signal from the stage before it. The stage creates digital bits representing its input and creates a new residue signal.

The digital outputs of each of the stages 214A . . . 214I are combined in digital logic 216 to produce the digital output 218. Digital logic 216 is a logic circuit as known in the art for producing a digital output that represents the input signal Sin at a specific point in time. Here the digital output 218 is shown to have 14 bits of resolution. However the number of bits of resolution is not critical to the invention.

FIG. 2A shows that random number generator 220 provides a random number as an input to each of the stages 214A . . . 214I. Random number generators are known in the art. Random number generator 220 can be of the type found in prior art analog to digital converters. However, as will be explained in greater detail in conjunction with FIGS. 3 and 4 below, the random number generated by random number generator 220 controls each of the stages 214A . . . 214I in a way that is different than in the prior art.

FIG. 2B is a timing diagram showing operation of the analog to digital converter 200 of FIG. 2A. A clock signal, denoted Q in FIG. 2B, provides overall timing for the operation of the analog to digital converter 200. One period of clock signal Q is denoted $T_1$. Each period $T_1$ is shown to be divided into 2 intervals, $T_S$ and $T_H$. In FIG. 2B, clock Q is shown to have a 50% duty cycle. However, it is not necessary that the intervals $T_S$ and $T_H$ be equal. In a preferred embodiment, it is desirable for the period of the clock to be as small as possible. Therefore, the intervals $T_S$ and $T_H$ will be chosen to be only slightly longer than needed for completion for the circuit operations, described in greater detail below, that must be performed in those intervals. In a preferred embodiment the circuit operations will be performed in such a way that each of the intervals can be made approximately one third of a nanosecond less then in a comparable converter mode without using techniques described herein.

Each stage of analog to digital converter 200 preferably performs one conversion in each period of clock Q. Each conversion results in a set of digital bits that are supplied to digital logic 216. Each conversion also results in a new residue signal that is applied to the next stage in the pipeline. In the subsequent period, the next stage in the pipeline will have that residue signal as its input and will provide more digital bits to digital logic 216 and a residue signal to the subsequent stage in the pipeline.

In the preferred embodiment illustrated in the following figures, $T_S$ will be referred to as the sampling interval. The interval $T_H$ will be referred to as a hold interval. As with the prior art, each of the stages 214A . . . 214I contains capacitors that are charged to a level representative of a signal that is to be measured. During the interval $T_S$, those capacitors are charging. During the interval $T_H$, the outputs of the stages become available. The transition from the sampling interval to the hold interval is sometimes called the "sampling trigger." The voltage stored on the sampling capacitors when the sampling trigger occurs is used to produce the output of the stage during the hold interval.

Figure 3:
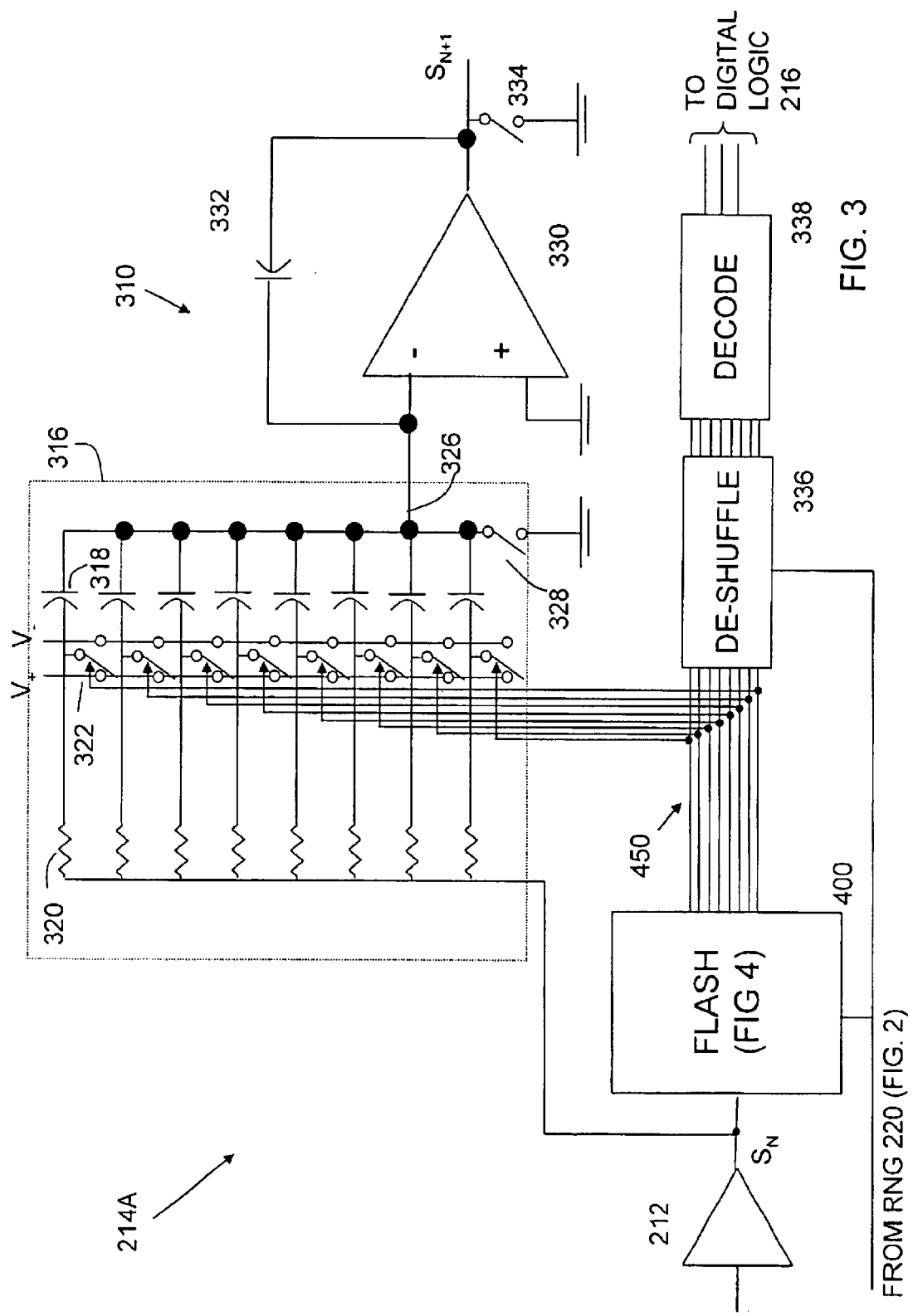
FIG. 3 is s sketch showing a stage of an analog to digital converter suitable for use in an improved analog to digital converter.

FIG. 3 illustrates a stage of analog to digital converter 200. Here, stage 214A is chosen as an illustration. The analog input to stage 314 is represented as signal $S_N$. For stage 214A, the input is provided as the output of a buffer amplifier 212, as shown in FIG. 2A. The signal $S_N$ is provided to flash converter 400 and multiplying digital to analog converter (MDAC) 310.

Figure 4:
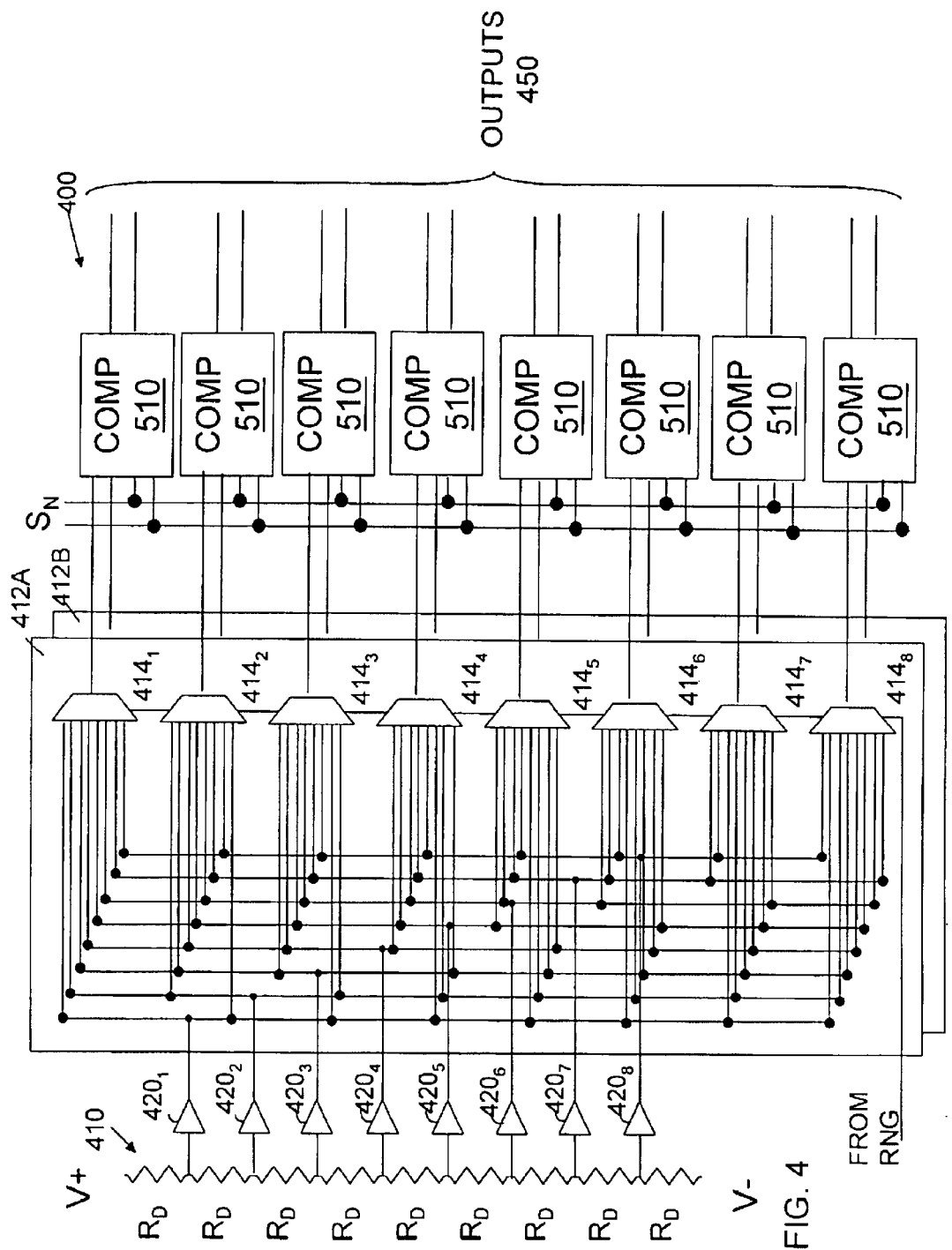
FIG. 4 is a simplified electrical schematic of a first subcircuit suitable for use in an improved analog to digital converter.

The construction of flash converter 400 is shown in more detail in FIG. 4. Flash converter 400 produces a plurality of digital outputs 450. These outputs represent the value of the input signal $S_N$ when the sampling trigger occurs. As with the prior art, the number of digital output lines 450 that is asserted indicates the magnitude of the input signal. However, unlike the prior art, the specific ones of the digital outputs 450 that are asserted is randomly selected in response to a random number provided by random number generator 220 (FIG. 2).

The digital outputs 450 from flash 400 are also applied to multiplying digital converter 310. Multiplying digital to analog converter 310 also receives the input $S_N$. Multiplying digital to analog converter produces a residue, $S_{N+1}$, by offsetting the input $S_N$ by a value representative of the digital outputs 450.

Multiplying digital to analog converter 310 includes a capacitor bank 316 and an amplifier 330. In the preferred embodiment, capacitor bank 316 is made up of a plurality of circuits that nominally are identical. For simplicity the components of only one of these subcircuits are numbered. Each subcircuit includes a capacitor 318, a resistor 320 and a switch 322. The resistor 320 of each subcircuit is connected at one end to the output of amplifier 302. At the other end resistor 320 is connected to one end of capacitor 318. The other end of capacitor 318 is connected to node 326, which forms the inverting input connection to amplifier 330. Between the resistor 320 and the capacitor 318 the pole of switch 322 is connected. Switch 322 has three operating states. In one position, switch 322 can connect one side of capacitor 318 to a positive reference voltage, denoted $V_+$. In another state, switch 322 can connect the capacitor to a negative reference voltage, denoted $V_-$. In a third state, switch 322 can be inactive and not influence the voltage on capacitor 318.

It should be appreciated that analog to digital converter 200 will preferably be implemented as an integrated circuit. In such an integrated circuit switches are well known. Switch 322 may be implemented as a combination of transistors or other circuit elements as are traditionally used in integrated circuits. Control circuitry to place switch 322 in an inactive state is not expressly shown. Suitable techniques for controlling a semiconductor switching circuit are known in the art and any such technique could be used.

For the illustrated embodiment, there are eight such subcircuits as shown in FIG. 3. As can be seen, each of the digital outputs 450 of flash converter 400 is connected to the control input of one of the switches 322. In this way, as in the prior art, the number of capacitors 318 connected to either $V_+$ or $V_-$ depends on the number of digital outputs of flash 400 that are asserted.

As was described above, each stage of analog to digital converter 200 produces an output for each period $T_1$ of the clock Q. During the sample interval, $T_s$ (FIG. 2B), the capacitors 318 are connected to the input $S_N$ through the resistors 320. Switch 328 is closed to ground the other end of the capacitors. In this way, capacitors 318 charge to a level representative of the value of the input signal. During the sample interval switches 322 are disabled so that they do not impact the voltage on capacitor 318.

During the hold interval, switch 328 opens and switch 322 becomes enabled. In this way, each of the capacitors will be connected at one end to node 326 at the input of amplifier 330 and at the other end to one of the reference supplies.

The number of capacitors connected to each of the references supplies will depend on the value of the signal as measured by flash converter 400. However, because the specific ones of the digital outputs 450 asserted is determined by random number generator 220, the specific capacitors connected to each reference during each period is randomly determined. Also during the sampling interval switch 334 is closed. Closing switch 334 connects the output of amplifier 330 to ground. In this way, both sides of capacitor 332 are connected to ground and capacitor 332 is discharged. Switch 334 also opens at the beginning of the hold interval.

MDAC 310 operates as an MDAC in the prior art. During the sample interval, the capacitors 318 are charged based on the input signal. During the hold interval, the number of capacitors connected to the positive and negative reference supplies determines an amount of offset. Amplifier 330 provides a gain to the signal after it has been offset. The offset has the effect of subtracting from the signal $S_N$ an amount representing the output of the flash converter 400. The amount of gain is determined by the ratio of the size of capacitor 318 to capacitor 332. The analog output $S_{N+1}$ is the residue signal for stage 314. This residue signal is then applied to the next stage in the analog to digital converter.

As with the prior art, the specific capacitors 318 connected to each of the positive and negative reference supplies is determined randomly. However, in contrast to the prior art, MDAC 310 does not require a switch matrix. Providing an MDAC without a switch matrix as illustrated in the preferred embodiment provides a timing advantage that will be explained below in FIG. 9.

Turning now to FIG. 4, additional details of flash converter 400 are shown. Flash converter 400 includes a reference ladder 410 as is known in the art. Reference ladder 410 consists of multiple series resistors $R_D$ connected between a positive voltage reference $V_+$ and a negative voltage reference $V_-$. In the preferred embodiments, all of the resistors $R_D$ are nominally the same resistance. In this way, the nodes between each pair of resistors establishes reference levels that are equally spaced between the positive and negative voltage references. In the illustrated embodiment, eight voltage levels are established. The number of reference levels dictates the resolution of the stage. It will be appreciated that a flash converter could be constructed with any number of reference levels.

The reference levels are fed through switch matrixes 412A and 412B to comparators 510. Here flash converter 400 is shown to include 8 comparators 510. Each of the comparators 510 receives an output from each of the switch matrixes 412A and 412B and also receives as an input the signal $S_N$, which is the analog input to the stage 314. Each of the comparators 510 produces a digital output. The digital output is high, or asserted, when the input signal $S_N$ is larger than the reference voltage coupled to that comparator through the switch matrixes 412A and 412B. The digital output is low, or not asserted, when the input signal $S_N$ is less than the reference voltage coupled to that comparator. In the illustrated embodiments, the analog signals, including the reference levels, are represented as differential values. The reference voltage to each comparator is the difference between the reference level coupled to that comparator by switch matrix 412A and the reference level coupled to that comparator by switch matrix 412B.

Details of operation of comparators 510 will be explained in connection with FIG. 5 below. However, as with MDAC 310, comparators 510 contain capacitors that are charged during the sample interval. When the sample trigger occurs, those capacitors are switched to hold the charge on those capacitors during a hold interval. During the hold interval, the actual comparison between the signal and reference values is made. Preferably, comparators 510 latch the value at their outputs as soon as possible after the comparison is made.

Matrix 412A is shown to contain multiplexers $414_1 \ldots 414_8$. Each of the multiplexers selects one of the reference levels from reference ladder 410 and applies it to an input of a corresponding comparator 510. The control inputs of each of the multiplexers $414_1 \ldots 414_8$ are provided by random number generator 220. As the output of random number generator 220 changes, the specific reference level coupled to each of the comparators 510 by matrix 412A will change randomly. In the preferred embodiment, each of the multiplexers $414_1 \ldots 414_8$ is wired so that for each value out of random number generator 220 a different reference level will be applied to each of the comparators 510. In this way, there will be a one-to-one relationship between the reference levels and the comparators. However, the specific comparator associated with each reference level will change randomly from cycle to cycle.

One of skill in the art will appreciate that the one-to-one relationship between reference levels and comparator inputs can be achieved in multiple ways. For example, the desired connections can be achieved by making each of the multiplexers $414_1 \ldots 414_8$ the same but using a different wiring configuration for each of the multiplexers to connect the switched inputs of the multiplexers to the reference ladder. In an alternative implementation, the control circuitry of each multiplexer $414_1 \ldots 414_8$ could be configured to select a different switched input for the same control input. As yet another variation, a separate circuit might be employed to convert one output of random number generator into different control inputs for each of the multiplexers $414_1 \ldots 414_8$. Accordingly, the specific circuit used is not critical to the invention.

Matrix 412B is constructed similarly to 412A. As with matrix 412A, matrix 412B provides a one-to-one mapping between reference voltages created by reference ladder 410 and a reference input to one of the comparators 510. However, matrix 412B is cofigured to ensure that each of the comparators 510 receives a different pair of reference voltages from matrixes 412A and 412B.

FIG. 4 shows that each of the reference outputs from reference ladder 410 is buffered in a buffer $420_1 \ldots 420_8$. Often in circuit design, signals that drive a capacitive circuit are buffered in an amplifier, such as amplifiers $420_1 \ldots 420_8$.

The size of the buffer amplifier and the amount of power it consumes depends on the capacitance of the circuit being driven and the time allowed for the input to switch states. An advantage of the preferred embodiment is that these buffer amplifiers can be made relatively small. In a preferred embodiment, these buffers might be omitted entirely. This advantage will be explained in connection with FIG. 9 below.

Timing signals that control switch matrixes 412A and 412B are not shown. However, one of skill in the art will understand that flash converter 400 includes timing signals as are conventional in a pipelined circuit. In a preferred embodiment, comparators 510 latch their outputs once they have completed the comparison between their signal and reference inputs. Once comparators 510 are latched, switch matrixes 412A and 412B can be switched to a new configuration as determined by the next output of random number generator 220. The process of changing the mapping of the reference levels to specific comparator inputs is called "shuffling." Preferably, shuffling begins as soon as possible after the comparators 510 are latched.

Returning now to FIG. 3, digital outputs 450 of flash converter 400 are applied as control inputs to MDAC 310. Because, matrixes 412A and 412B serve to randomly shuffle the reference inputs to comparators 510 the control signals to MDAC 310 re effectively shuffled. However, the shuffling occurs in a different way than in the prior art, which allows the overall time for a conversion to be reduced.

Because the digital outputs 450 are "shuffled", it is sometimes advantageous to de-shuffle the digital outputs 450 before applying them to digital logic 216. De-shuffling results in the digital outputs 450 being reordered so that the output from the comparator with the most negative reference value is the first output and the output of the comparator with the most positive reference input is the last output. The outputs in between are reordered based on the reference input applied to the comparator to produce that output. Accordingly, the output of de-shuffle circuit 336 represents an output of a flash converter as is found in the prior art. Therefore the output of de-shuffle circuit 336 can be provided to a decoder 338 as was used in the prior art.

Decode circuit 338 converts signals in the form of digital outputs 450 in which the magnitude of the input signal is represented by a number of digital lines that is asserted into a binary weighted digital signal. As shown in FIG. 3, if digital output 450 consists of eight separate digital lines, after processing by decoder circuit 338 only 3 digitally weighted lines are needed to represent the same level. Decoder circuit 338 therefore reduces the number of lines that are routed to digital logic 216 for further processing. However, it should be appreciated that this step is not required for use of the invention. Turning now to FIG. 5 additional details of one of the comparators 510 is shown. As described above, all of the comparators 510 can be implemented as identical circuit blocks even though the specific reference inputs applied to each is different.

Figure 5:
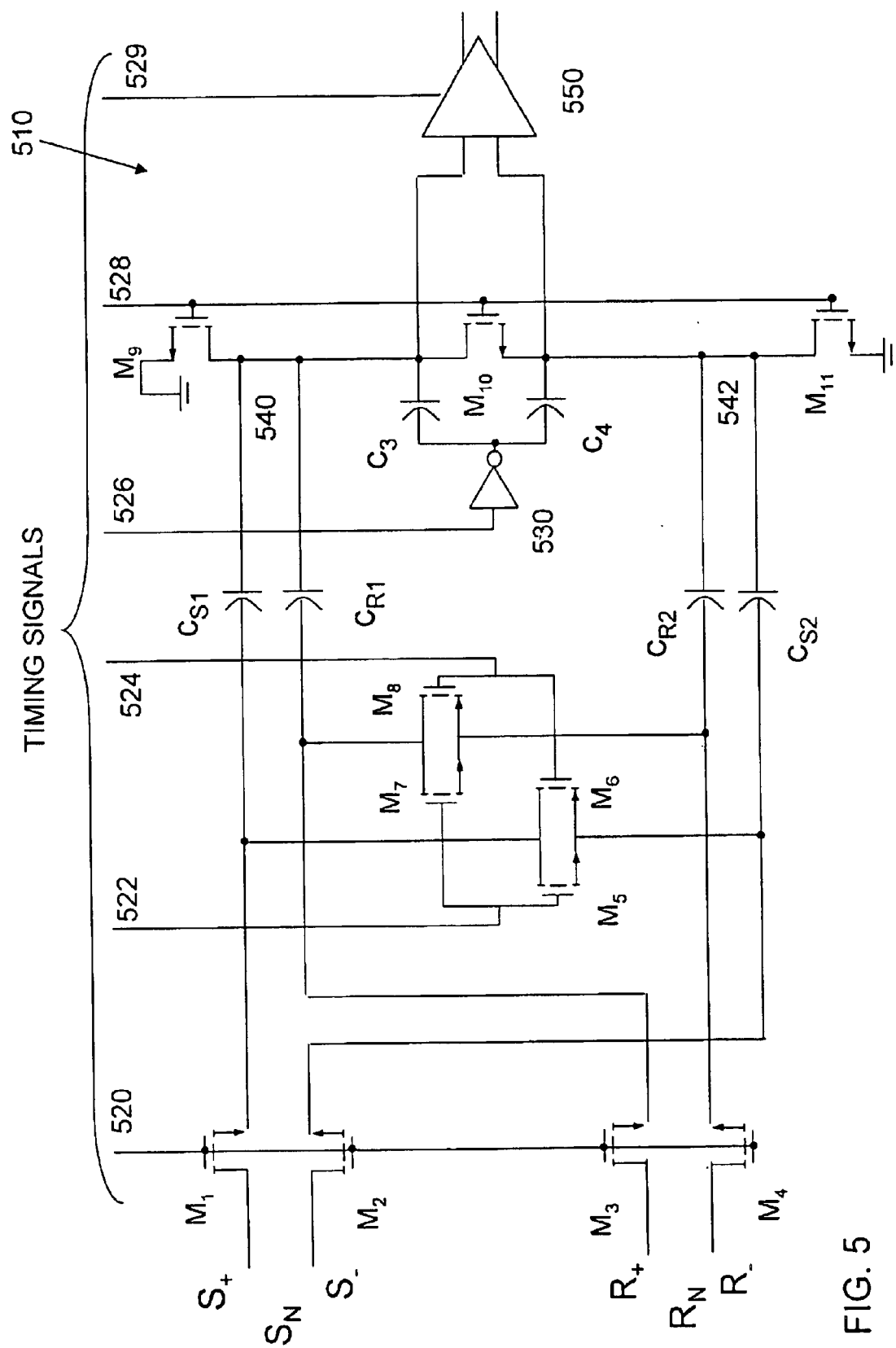
FIG. 5 is a simplified electrical schematic of latching comparator suitable for use in the subcircuit of FIG. 4.

FIG. 5 shows that latching comparator 510 has a signal input, $S_N$, and a reference input, $R_N$. Each of these signals in the preferred embodiment is a differential signal represented on two lines, $S_+$ and $S_-$ and $R_+$ and $R_-$. Each of these signals is routed into comparator 510 through a transistor operating as a switch. Signal $S_+$ is routed through transistor $M_1$. Signal $S_-$ is routed through transistor $M_2$. Signal $R_+$ is routed through transistor $M_3$. Signal $R_-$ is routed through transistor $M_4$.

Each of the transistors $M_1 \ldots M_4$ is controlled by timing signal 520. During the sampling interval, timing signal 520 is asserted to turn on each of the transistors $M_1 \ldots M_4$. With transistors $M_1 \ldots M_4$ turned on, the input signals are applied to capacitors. Input $S_+$ is applied to capacitor $C_{S1}$. Input $S_-$ is applied to capacitor $C_{S2}$. Input $R_+$ is applied to capacitor $C_{R1}$ and input $R_-$ is applied to capacitor $C_{R2}$.

The second ends of capacitors $C_{S1}$, $C_{S2}$, $C_{R1}$, and $C_{R2}$ are connected to transistors $M_9$, $M_{10}$, and $M_{11}$. Transistors $M_9$ and $M_{11}$ act as switches that connect the ends of the capacitors to ground when closed. Transistor $M_{10}$ shorts the ends of the capacitors together when closed. The transistors $M_9$, $M_{10}$, and $M_{11}$ are controlled by timing signal 528. When timing signal 528 is asserted, the ends of capacitors $C_{S1}$, $C_{S2}$, $C_{R1}$, and $C_{R2}$ are effectively connected together at a reference potential. Timing signal 528 is asserted during the sampling interval. In this way the four capacitors $C_{S1}$, $C_{S2}$, $C_{R1}$, and $C_{R2}$ are charged to a level dictated by the inputs $S_N$ and $R_N$.

Capacitors C3 and C4 are connected to transistor M10 and to inverter 530. These capacitors provide charge cancellation to reduce any glitches at nodes 540 and 542 when transistor $M_{10}$ switches. They are not critical to the invention.

At the end of the sampling interval, timing signals 520 and 528 are de-asserted. Transistor switches $M_1 \ldots M_4$ open, disconnecting one end of the capacitors $C_{S1}$, $C_{S2}$, $C_{R1}$, $C_{R2}$ from the inputs. At the end of the sample interval timing signal 528 is also de-asserted. Transistor switches $M_9$, $M_{10}$, and $M_{11}$ also open. With these transistors open, nodes 540 and 542 may take on different voltages. Once switches $M_9 \ldots M_{11}$ are open control signals 522 and 524 are asserted. When control signals 522 and 524 are asserted transistors $M_5$, $M_6$, $M_7$, and $M_9$ are turned on. Transistors $M_5$ and $M_6$ form a transmission gate. Likewise, transistors $M_7$ and $M_8$ form a transmission gate. The transmission gate formed by transistors $M_5$ and $M_6$ connect capacitors $C_{S1}$ and $C_{S2}$. The transmission gate formed by transistors $M_7$ and $M_8$ connect to transistors $C_{R1}$ and $C_{R2}$. In this configuration, the potential difference between nodes 540 and 542 represents a difference in voltage between signal $S_N$ and $R_N$ at the end of the sampling interval. Nodes 540 and 542 are connected to the positive and negative inputs of comparator 550, respectively.

Comparator 550 is a latching comparator that latches its output when timing signal 529 is asserted. In the preferred embodiment, timing signal 529 is timed to be asserted a sufficient time after signals are applied to the inputs of comparator 550 to allow the comparator to settle to a reliable output. Once timing signal 529 is asserted, comparator 510 can be prepared to take another sample. Therefore, it is desirable for signal 529 to be asserted as soon as possible. To prepare comparator 510 for the next sample, timing signals 522 and 524 are de-asserted, thereby opening the transmission gates by transistor pairs $M_5$ and $M_6$ and $M_7$ and $M_8$. Timing signal 528 can then be asserted, connecting nodes 540 and 542 together and to ground. Timing signal 520 can then be asserted, allowing the signals $S_N$ and $R_N$ to charge the capacitors $C_{S1}$, $C_{S2}$, $C_{R1}$, and $C_{R2}$. Also, when timing signal 529 is asserted a new random number can be applied to switch matrixes 412A and 412B to begin "shuffling" the reference inputs to the comparators 510. The benefit of being able to shuffle the reference inputs is explained below in connection with FIG. 9.

The specific circuits and components used to implement comparator 510 are not critical to the invention and should be designed using techniques known in the art. For example, latching comparator 550 can be any comparator circuit as known in the art. Likewise, transistors $M_1, M_2 \ldots M_{11}$ will be designed to have low on resistance, but the specific sizes are not critical to the invention. In the preferred embodiment, capacitors $C_{S1}$, $C_{S2}$, $C_{R1}$ and $C_{R2}$ are designed to be the same size. Also, circuiting to generate timing signals is well known in the art and is not expressly shown.

Figure 6:
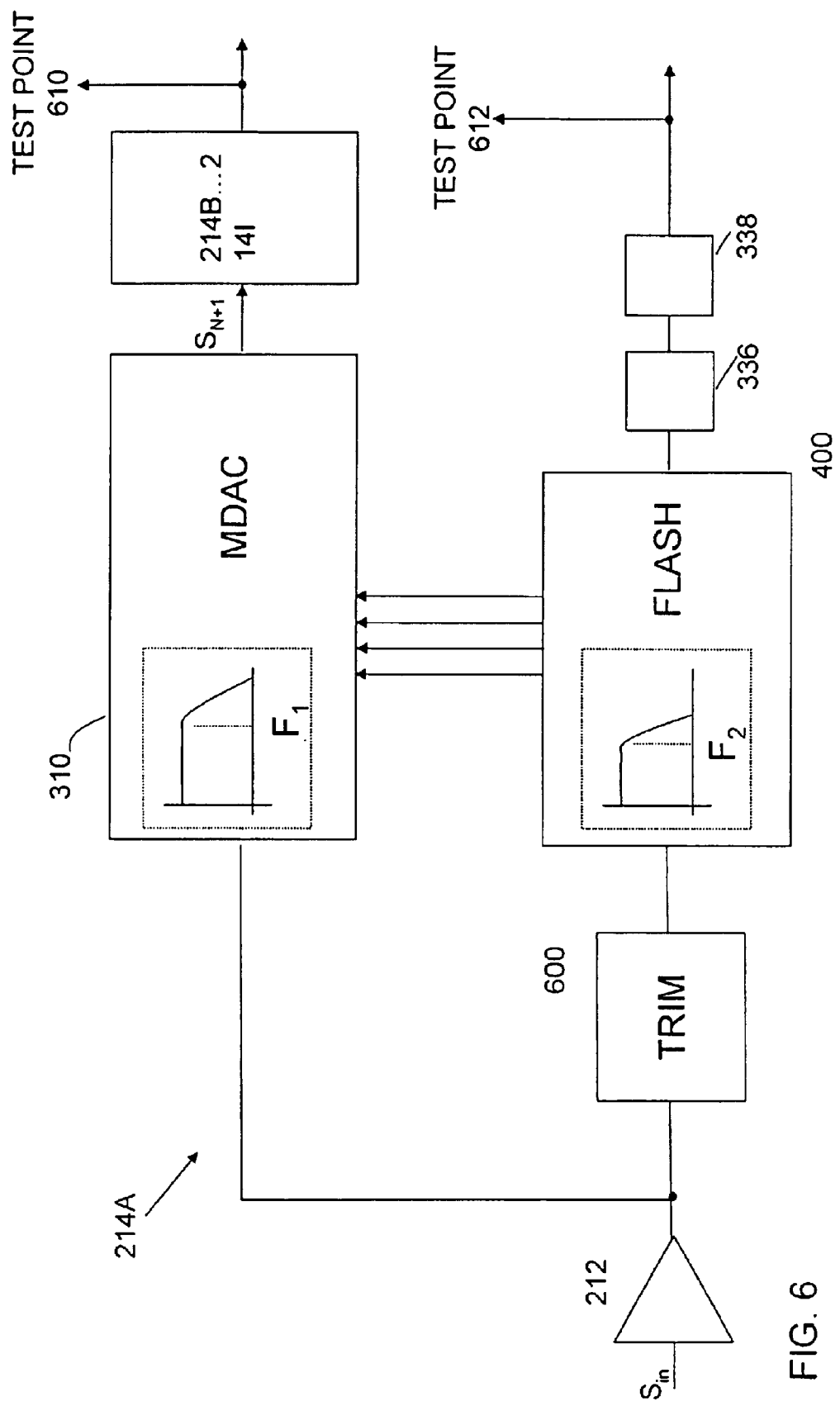
FIG. 6 is a sketch useful in understanding use of a trim circuit.

Turning now to FIG. 6, a trim circuit 600 that may optionally be included to digital converter 200 is shown. In the preferred embodiment, trim circuit 600 is included only within the first stage 214A. Trim circuit 600 increases the accuracy of the conversion performed by analog to digital converter 200 more accurately relating the signal as seen by the flash converter to the input as seen by the MDAC.

As shown in FIG. 6, an input signal, $S_{in}$ is applied to a buffer amplifier 302. The output of buffer amplifier 212 is provided to flash converter 400 and multiplying digital to analog converter 310. As described above, flash converter 400 and multiplying digital to analog converter 310 each include capacitors that are charged by the input signal during a sample interval. Upon transition to a hold interval, these capacitors are disconnected from their input signals and connected to a device that measures charge stored on a capacitors. In the case of multiplying digital to analog converter 310, this measuring device is amplifier 330. In the case of flash converter 400, this measuring device is latching comparator 550. For stage 214A of the analog to digital converter 200 to work accurately, the hold operation performed by multiplying digital to analog converter 310 and the hold operation performed by flash converter 400 should be operating on the same signal. Ideally, multiplying digital to analog converter 310 and flash converter 400 will enter the hold period in response to the same sample trigger. Additionally, the multiplying digital to analog converter 310 and flash converter 400 should respond in the same way to the input signal. In some scenarios, without trim circuit 600, MDAC 310 and flash converter 600 do not respond proportionately to the same input signal.

Because both multiplying digital to analog converter 310 and flash converter 400 connect their input signals to capacitors, both have an input impedance that can be modeled as a low pass filter. However, the specific components within multiplying digital to analog converter 310 and flash converter 400 are different, resulting in different cut off frequencies for the low pass characteristics of each. FIG. 6 shows this difference schematically by showing multiplying digital to analog converter 310 with an input frequency response with a cut off at frequency $F_1$ In contrast, flash converter 400 is illustrated schematically as having a low pass input response with a cut off frequency of $F_2$. As seen in the illustration $F_2$ is lower than $F_1$.

The difference in cut off frequencies between $F_1$ and $F_2$ means that multiplying digital to analog converter 310 and flash converter 400 are effectively processing different signals. This difference is particularly significant for frequencies generally in the range between $F_1$ and $F_2$. A frequency in this range will be attenuated much more in flash converter 400 than in multiplying digital to analog converter 310. Thus, when the residue $S_{N+1}$ is computed in multiplying digital to analog converter 310, an error is introduced.

To reduce the significance of this error, trim circuit 600 is inserted into stage 214A. Trim circuit 600 equalizes the input impedances between multiplying digital to analog converter 310 and flash converter 400. In the preferred embodiment trim circuit 600 is inserted between buffer amplifier 302 and the input of flash converter 400. One simple example of a trim circuit is a variable resistance. Because flash converter 400 has an input impedance largely determined by the RC time constant associated with the capacitors inside flash converter 400, the cutoff frequency $F_2$ can be changed by changing the resistance in series with those capacitors.

In the preferred embodiment, a trim circuit 600 using resistors is used. Resistors are relatively easy to fabricate in semiconductor chips. However, other circuit elements are also known to vary the cutoff frequency of a circuit and other forms of trim circuits can be used. For example, rather than increasing the cutoff frequency $F_2$, cutoff the frequency $F_1$ could be decreased.

Figure 7:
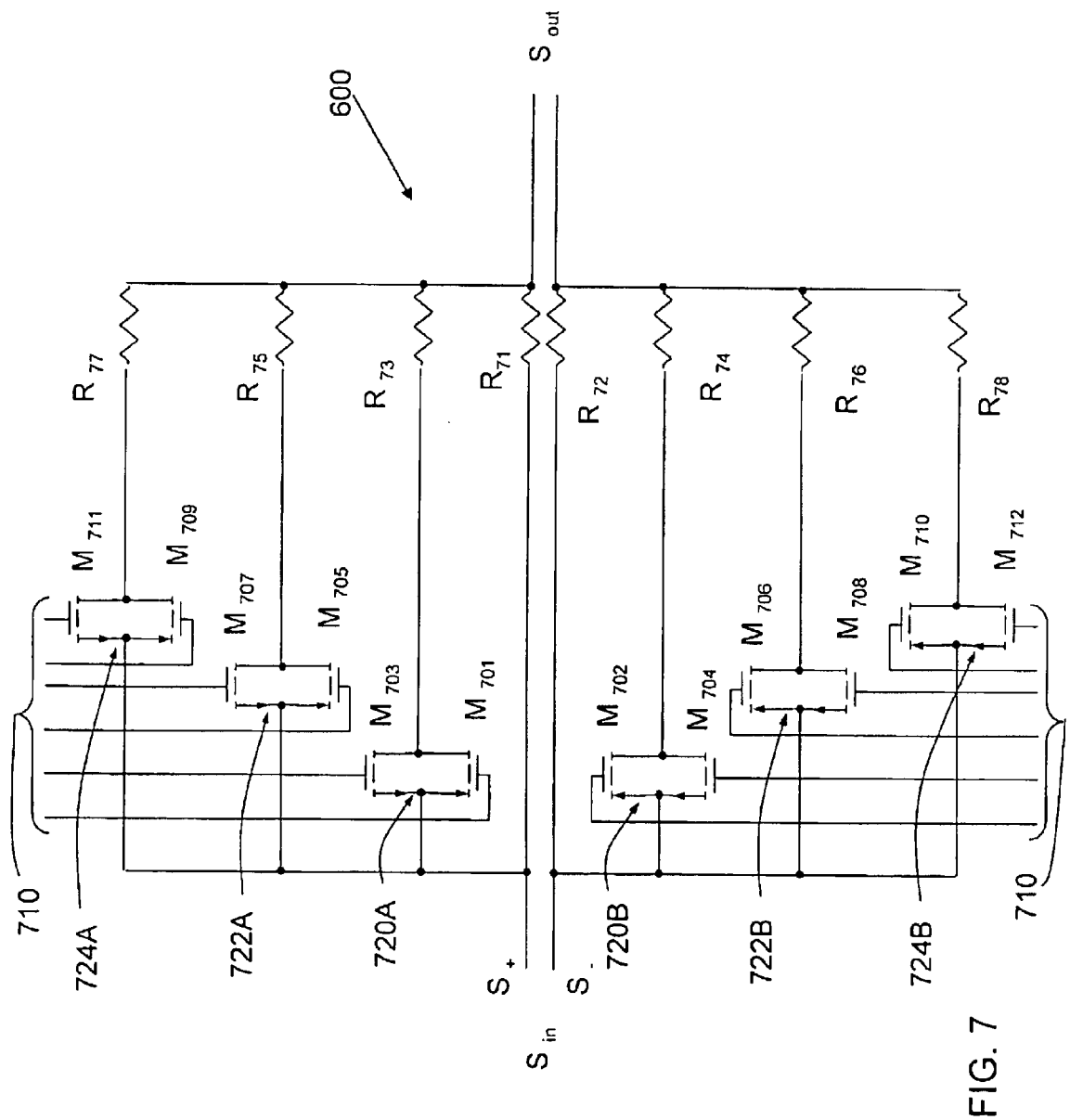
FIG. 7 is a simplified electrical schematic showing a preferred embodiment of the trim circuit of FIG. 6.

FIG. 7 shows a preferred embodiment of trim circuit 600. In the preferred embodiment, the input signal $S_{in}$, is a differential signal. The input signal has legs $S_+$ and $S_-$. Each of the legs is applied to variable resistance network. Signal $S_+$ is coupled to the output through resistor $R_{71}$. Trim circuit 600 includes additional paths that can be connected in parallel with resistor $R_{71}$ to change the resistance between the input and the output of trim circuit 600.

Transistors $M_{703}$ and $M_{704}$ act as a transmission gate 720A that can connect resistor $R_{73}$ in parallel with resistor $R_{71}$, thereby reducing the resistance between the input and output of trim circuit 600. Transistors $M_{705}$ and $M_{707}$ also operate as a transmission gate 722A that can connect resistor $R_{73}$ in parallel with resistor $R_{71}$.

Transistors $M_{709}$ and $M_{711}$ form a third transmission gate 724A that can connect resistor $R_{77}$ in parallel with resistor $R_7$. By altering the number of transmission gates that are turned on, the resistance between input and output of trim circuit 600 can be controlled.

Signal $S_-$ is applied to a similar resistive network. Transistors $M_{702}$ and $M_{704}$ form a transmission gate 720B that can connect resistor $R_{74}$ in parallel with resistance $R_{72}$ to reduce the resistance between the input and output. Likewise transistors $M_{706}$ and $M_{708}$ form a transmission gate 722B that can connect resistor $R_{76}$ in parallel with resistor $R_{72}$. Transistors $M_{710}$ and $M_{712}$ also form a transmission gate 724B that connects resistor $R_{78}$ in parallel with resistor $R_{72}$.

Preferably, the resistors $R_{72}$ and $R_{71}$ have the same value. Likewise resistors $R_{74}$ and $R_{73}$ will have the same value. Resistors $R_{75}$ and $R_{76}$ will have the same value and resistors $R_{77}$ and $R_{78}$ will have the same value. The specific values of the resistors is not critical to the invention. However, in the preferred embodiment the values of resistors $R_{71}$ and $R_{72}$ are chosen to provide a greater change in the input impedance of flash converter 400 than is likely to be needed in practice. The value of the remaining resistances are chosen so that when all of the resistors are connected in parallel, trim circuit 600 changes the input impedance of flash converter 400 less than is likely to be required. In this way, turning on some combination of transmission gates results in the trim circuit having the desired resistance. One of skill in the art can compute the required range of resistances by computing the input impedances of multiplying digital to analog converter 310 and flash converter 400 taking into account the likely range of variations in components.

In order to select the appropriate value for the resistance provided by trim circuit 600, a calibration procedure is used. During the calibration procedure, the specific ones of the resistors $R_{73}$ ... $R_{78}$ to be switched in parallel with resistors $R_{71}$ and $R_{72}$ is determined. Control inputs 710 control which of the transmission gates 720A, 722A, 724A, 720B, or 724B is closed. By adjusting the inputs 710, the resistance provided by trim circuit 600 can be adjusted, which ultimately equalizes the input impedances of flash converter 400 and multiplying digital to analog converter 310. Preferably the same control inputs are applied to transmission gates 720A, 722A and 724A as are applied to transmission gates 720B, 722B, and 724B to balance the impact on $S_+$ and $S_-$.

FIG. 8 shows the process used to adjust the resistance provided by trim circuit 600. In the preferred embodiment, calibration process will be performed during manufacture of analog to digital converter 200. Preferably, it is performed during probe testing of the parts so that test points internal to the device can be measured. Probe testing semiconductor devices is well known in the art. Trimming devices as a result of probe testing is also well known in the at.

In the preferred embodiment, the values for control inputs 710 are stored on the chip once determined as part of the calibration process. For example, a nonvolatile memory can be used. Alternatively, a laser can be used to physically alter storage locations in the part. As another alternative, the laser could change the resistance provided by trim circuit 600 directly by laser trimming of resistors. Accordingly, the precise mechanism by which the control information is stored for trim circuit 600 is not important to the invention.

FIG. 8 shows the process by which the appropriate amount of trim is determined. The process begins at step 810. In step 810 a test input is applied to analog to digital converter 600. The test input is shown as signal 812. In the preferred embodiment the test signal 812 is a periodic signal that varies between $V_+$ and $V_-$. The values $V_+$ and $V_-$ indicate the limits of the dynamic range of the analog to digital converter. In the preferred embodiment, test input 812 is a sinusoid. Preferably, the sinusoidal signal 812 will be of a frequency generally in the range between $F_1$ and $F_2$.

At step 814 the residue out of multiplying digital to analog converter 310 in stage 214A is measured. As described above, in the preferred embodiment, trim circuit 600 is included only in stage 214A. Where a trim circuit is used in other stages of the analog to digital converter, the residue out of those stages would be examined. In the preferred embodiment where only the first stage 214A in the pipeline of analog to digital converter 200 is trimmed, the residue out of that stage can be obtained in digital form by measuring the combined digital outputs of the subsequent stages 214B . . . 214I. Alternatively, the analog residue output of stage 214A could be measured. FIG. 6 shows a test point 610 has been included in analog to digital converter 200 in order to measure the digital output of stages 214B . . . 214I.

Regardless of the specific manner in which the residue is measured, at step 814 the measured residue is examined. If flash converter 400 and multiplying digital to analog converter 310 are operating on the same input signal, the residue out of stage 214A should vary as the input to analog to digital converter 200 changes. However, the variation is the residue should be smaller than the variation in the input signal. Accordingly, the size of the residue can be used as a guide to how well trimmed the inputs are. In a preferred embodiment the variation in the residue signal is ideally less then one half the dynamic range of the analog to digital converter. While the specific value of the residue should vary as the input signal varies, if flash converter 400 is properly trimmed relative to multiplying digital to analog converter 310, the residue signal will appear generally as shown as signal 820 in FIG. 8.

Signal 820 varies in relation to the input signal 812. However, its maximum value stays within the prescribed range. For the example given here, that range is between one half of $V_+$ or $V_-$, (i.e., one half of the dynamic range). However it is possible that a wider range might be used to account for deviations from the ideal range than can not be trimmed. For example a range from $V_+$ to $V_-$ might be used.

Conversely, signal 822 represents a residue signal such as might be formed if the input impedance of flash converter 400 is not trimmed to match multiplying digital to analog converter 310. Signal 822 also varies periodically as the test signal 812 varies. However, unlike signal 820 the peak amplitudes of signal 822 are not limited to the prescribed range. Signal 822 results when the flash 400 and MDAC 310 have different cutoff frequencies. If the impedances to flash converter 400 and multiplying digital to analog converter 310 have different cutoff frequencies, flash converter 400 is effectively processing a different signal than is being provided to multiplying digital to analog converter 310. Consequently, when the output of flash converter 400 is subtracted from the input to multiplying digital to analog converter 310 to create the residue signal, the amount subtracted could be more or less than is needed to keep the residue signal in the prescribed range.

Accordingly, by examining the residue out of the first stage of the analog to digital converter, it is possible to determine whether trim circuit 600 is properly adjusted. If at step 816 it is determined that the residue signal is outside the range, processing proceeds to step 824. At step 824, the trim circuit 600 is adjusted. In the preferred embodiment shown in FIG. 7, adjusting the trim circuit means opening or closing selected ones of the transmission gates 720A, 722A, or 724A and 820B, 822B or 824B.

Once a trim adjustment is made at step 824, processing returns to step 810. In this way, trim circuit 600 will be iteratively adjusted until the proper value of the residue signal is observed. When the proper value of reside signal is observed, processing proceeds from step 816 to step 826. At step 826 the trim values are stored. The manner of storing trim values will be determined by the construction of analog to digital converter 200. Trim values might be stored by storing electrical charge in a nonvolatile memory inside the analog to digital converter. Alternatively the trim values can be stored by physically altering the semiconductor chip holding analog to digital converter 200, such as by laser trimming of resistors or blowing fuses that would lock control inputs 710 in the desired state. One of skill in the art will appreciate that many ways are known to adjust semiconductor integrated circuits and any suitable method could be used.

Turning now to FIG. 9, the timing of an analog to digital converter 200 made according to the preferred embodiment is described. FIG. 9A shows timing in a prior art analog to digital converter. For reference, the clock Q is shown, including a sample interval and a hold interval. Transition between the sample and hold interval occurs at time $t_0$. During the sample interval, the capacitors within multiplying digital to analog converter 310 and flash converter 400 are charging to track the input signal. At time to these capacitors are disconnected from their inputs and hold the charge they have stored. Multiplying digital to analog converter 310 and flash converter 400 produce outputs based on the charge stored at time $t_0$.

FIG. 9A shows that the flash converter produces a stable output at time $t_1$, which is shortly after time $t_0$. Because the output of multiplying digital to analog converter 310 depends on the output of flash 400, multiplying digital to analog converter 310 cannot produce a stable output until some time after flash converter 400 has a stable output. Thus, FIG. 9A shows the output of multiplying digital to analog converter 310 becomes stable at time $t_3$.

The outputs of flash converter 400 control switches within multiplying digital to analog converter 310. In the prior art, the specific switch controlled by each output of flash converter 400 was determined randomly. As a result, time was needed for "shuffling" the connections between the outputs of flash 400 and the switches inside multiplying digital to analog converter 310. Because the shuffling depends on the output of flash 600, shuffling could not begin until time $t_1$. FIG. 9A shows that the shuffling is complete at time $t_2$, which is after $t_0$. Time $t_3$, when the output of multiplying digital to analog converter 310 is stable, does not occur until some time after $t_2$.

FIG. 9B shows an advantage that can be achieved with the preferred embodiment described above. As in FIG. 9A the output of flash converter 400 is stable at time $t_1$. However, as shown in FIG. 3, the digital outputs 450 of flash 400 are not shuffled before they are applied to multiplying digital to analog converter 310. As a result, the output of multiplying digital to analog converter 310 becomes stable at time t, which is sooner than time $t_3$.

Nonetheless, the preferred embodiment still provides the benefits of shuffling. FIG. 9B illustrates that flash converter 400 as shown in FIG. 4 and FIG. 5 provides shuffling. As described above, the outputs 450 of flash converter 400 are provided by comparators 510. The output stage of comparators 510 is a latching comparator 550. At time $t_1$ when the outputs of flash converter 400 are stable, those values are latched. Thus the inputs to comparators 510 can be changed at time $t_5$ that is shortly after time $t_1$. As described above in connection with FIG. 4, switching matrixes 412A and 412B perform the shuffle function in the preferred embodiment. The switch setting of matrixes 412A and 412B can therefore be changed at time $t_5$. Despite the fact that analog to digital converter 200 is still in the hold interval, control signal 520 can be asserted to connect both the signal and reference input to the capacitors inside comparators 510. Capacitors $C_{R1}$ and $C_{R2}$ can begin charging as early as the time $t_5$. Those capacitors do not need to be at a stable value until a time $t_6$, which can be anytime before the next hold interval.

As an additional advantage, capacitors $C_{R1}$ and $C_{R2}$ can be allowed to charge slowly in the time between $t_5$ and $t_6$. The rate of charge of the capacitors $C_{R1}$ and $C_{R2}$ will depend on the amount of current sourced by the buffer amplifiers $420_1 \ldots 420_8$. As is known in the art, making a buffer amplifier that sources a large amount of current requires the buffer amplifier to occupy more space on the semiconductor chip. Therefore, providing a circuit in which buffer amplifiers $420_1 \ldots 420_8$ do not need to provide a large amount of current reduces the size of the chip needed to build analog to digital converter 200. Also, the amount of power required in the buffer amps is reduced. Because the output of multiplying digital to analog converter is stable at time $t_4$, which does not depend on the shuffle operation being completed, reducing the size of buffer amplifiers $420_1 \ldots 420_8$ does not impact the performance of the analog to digital converter 200.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

For example, it should be appreciated that the specific circuits shown in the present application are for illustration. For example, it is not necessary that differential signals be used.

Also, it is described that the trim procedure of FIG. 8 is performed when analog to digital converter chips are manufactured. It is not possible that the trim procedure could be performed at other times, such as before a chip is mounted to a circuit board, or the procedure might be performed on the chip as installed in an electrical system.

As another variation, it might not be possible to adjust trim circuit 600 to place the residue in the desired range. Accordingly the method of FIG. 8 might include a step to stop the trim process when no further adjustments are possible.

Also, a resistive trim circuit 600 is described in the preferred embodiment. It should be appreciated that other types of trim circuits could be created to perform the function of balancing the relative inputs to subcircuits. Various combinations of amplification, attenuation and phase shifting can be used to create a trim circuit that is connected to the input of either of the subcircuits or, in some embodiments, to both.

Further, it is described that random numbers are generated to control switching circuits 412A and 412B. It should be appreciated that, in this context, random means that the value changes over time to values that are not derived from the value of the signal being processed. A "random number generator" that generates values based on electronic noise could be used. Alternatively, a "random" number generator, such as those that are polynomial based, that outputs a string of values that do not repeat until the string reaches a very long length could be used. Thus, circuits that generate a string of values that are uncorrelated to the input, even if that string of values is predictable, can be considered "random" in this context. Preferably, the distribution of control values will be uniformly distributed, but one of skill in the art could construct multiple circuits that will generate an appropriate string of control values.

What is claimed is:

1. An analog to digital converter comprising:
   a) a first subcircuit having an input and a digital output representative of the input;
   b) a second subcircuit having an input and an analog output representative of the input to the second subcircuit offset by an amount determined by the digital output of the first subcircuit;
   c) an analog input coupled to the input of the first subcircuit and the input of the second subcircuit; and
   d) a trim circuit connected to the signal path coupling the analog input to the input of one of the first subcircuit and the second subcircuit.

2. The analog to digital converter of claim 1 wherein the trim circuit is connected between the analog input and the input of the first subcircuit.

3. The analog to digital converter of claim 2 wherein the trim circuit comprises a variable resistance element.

4. The analog to digital converter of claim 3 wherein the variable resistance element has a control input and the trim circuit additionally comprises nonvolatile memory elements storing a value of the control input.

5. The analog to digital converter of claim 1 wherein the first and second subcircuits comprise the input stage of a pipelined analog to digital converter.

6. The analog to digital converter of claim 1 wherein the first subcircuit is a flash converter.

7. The analog to digital converter of claim 1 additionally comprising a test point coupled to the analog output of the second subcircuit.

8. The analog to digital converter of claim 1 additionally comprising a plurality of additional subcircuits connected to the analog output of the second subcircuit to form a pipelined converter.

9. The analog to digital converter of claim 8 wherein the first subcircuit is a flash converter.

10. The analog to digital converter of claim 1 wherein the input of the first subcircuit and the input of the second subcircuit are coupled to the analog input without passing through a sample and hold circuit.

11. The analog to digital converter is claim 9 wherein the second subcircuit is a multiplying digital to analog converter.

12. The analog to digital converter of claim 1 wherein the trim circuit comprises a plurality of resistors and a plurality of switches, with each resistor connected to a switch.

13. A method of manufacturing an analog to digital converter comprising:
   a) providing an analog to digital converter comprising:
      i) an analog input;
      ii) a first subcircuit having an input and a digital output representative of the input;
      iii) a second subcircuit having an input and an analog output representative of the input to the second subcircuit offset by an amount determined by the digital output of the first subcircuit; and
      iv) a trim circuit connected between the analog input and the input of one of the first subcircuit and the second subcircuit with the input of the other of the first subcircuit and the second subcircuit coupled to the analog input without passing through the trim circuit;
   b) coupling a test signal to the analog input;
   c) measuring the analog output of the second subcircuit;
   d) altering the trim circuit when the measured analog output falls outside of an expected range.

14. The method of claim 13 wherein the trim circuit comprises a resister and altering the trim circuit comprises using a laser to alter the resistance of the resistor.

15. The method of claim 13 wherein the first subcircuit and the second subcircuit have inputs with low pass transfer functions with different cutoff frequencies and the test signal has frequency components between the cutoff frequencies of the first and second subcircuits.

16. The method of claim 13 wherein the process of measuring the analog output and altering the trim circuit is repeated until the measured output falls in the expected range.

17. The method of claim 13 wherein the analog to digital converter has a dynamic range and the digital output of the first subcircuit correlates to bits defining a band in this dynamic range and the expected range is derived from the lower end of the band.

18. The method of claim 13 wherein the analog to digital converter has a dynamic range and the expected range is less than the dynamic range.

19. The method of claim 18 wherein the expected range is less than half the dynamic range.

20. The method of claim 13 wherein the trim circuit comprises a plurality of resistors and a plurality of switches that can selectively connect the resistors to a signal path through the trim circuit and altering the trim circuit comprises controlling switches to change the number of resistors connected to the signal path.

21. The method of claim 20 additionally comprising, when the measured output falls within an expected range, storing values of control inputs to the plurality of switches in non-volatile memory in the analog to digital converter.

22. The method of claim 13 wherein the analog to digital converter is a pipelined analog to digital converter and the first subcircuit and the second subcircuit are part of a first stage in the pipeline and the analog output of the second subcircuit is coupled to subsequent stages in the pipeline, and measuring the analog output of the second subcircuit comprises observing digital outputs generated by subsequent stages in the pipeline.

23. A pipelined analog to digital converter comprising a plurality of stages, each of the stages receiving an analog input and producing a digital output and an analog residue signal representative of the difference between the analog input and the digital output, each stage comprising:
   a) a flash converter comprising:
      i) a plurality of comparators, each comparator producing a digital signal forming a portion of the digital output, and each comparator having a first input coupled to the analog input and a second input, wherein the state of the digital signal is determined by the relative levels of the analog input and the second input,
      ii) a reference ladder generating a plurality of reference levels coupled to the second input of one of the plurality of comparators;
   b) a multiplying digital to analog converter comprising:
      i) an amplifier having an input and an output generating the residue signal;
      ii) a plurality of capacitors having first and second ends, the second end of each of the capacitors connected to the input of the amplifier;
      iii) a plurality of switches, each switch connected to the first end of one of the capacitors, each of the switches having a control input and providing at least three connection states in response to the control input whereby the first end of each capacitor can be coupled to one of two reference voltage signals or the analog input, wherein the digital signal produced by one of the comparators forms a portion of the control input to one of the switches; and
   c) a trim circuit in the first stage in the pipelined converter connected in the signal path between the analog input and the input of the flash converter.

24. The pipelined analog to digital converter of claim 23 additionally comprising digital logic circuitry having as an input digital signals produced by each of the comparators in each of the stages and providing as an output the digital output of the analog to digital converter.

25. The pipelined analog to digital converter of claim 24 wherein the digital logic includes, for each stage, a digital encoder having as input the digital signals produced by the comparators and as output a binary weighted representation of the input to the encoder.

* * * * *